US009667235B1

(12) United States Patent
Wyse et al.

(10) Patent No.: US 9,667,235 B1
(45) Date of Patent: May 30, 2017

(54) ULTRA-PRECISION LINEAR PHASE SHIFTER WITH GAIN CONTROL

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1203 days.

(21) Appl. No.: 13/714,209

(22) Filed: Dec. 13, 2012

(51) Int. Cl.
*H01Q 3/00* (2006.01)
*H03K 5/13* (2014.01)

(52) U.S. Cl.
CPC ..................... *H03K 5/13* (2013.01)

(58) Field of Classification Search
CPC ............... H03K 5/13; H03K 342/372
USPC .......................................................... 342/372
See application file for complete search history.

(56) References Cited

U.S. PATENT DOCUMENTS

| 2,813,247 | A |   | 11/1957 | Decker |
|---|---|---|---|---|
| 4,398,161 | A | * | 8/1983 | Lamb .................. H01P 1/18 333/156 |
| 4,437,070 | A |   | 3/1984 | Horl |
| 5,166,648 | A | * | 11/1992 | Wen .................. H03H 11/20 327/100 |
| 5,321,746 | A |   | 6/1994 | Bader |
| 5,323,121 | A | * | 6/1994 | Butler .................. H03F 3/3088 330/252 |
| 5,828,763 | A |   | 10/1998 | Koyano et al. |
| 6,684,065 | B2 |   | 1/2004 | Bult et al. |
| 6,954,623 | B2 | * | 10/2005 | Chang .................. H03F 3/602 330/124 R |
| 6,998,918 | B2 |   | 2/2006 | Doherty et al. |
| 7,076,226 | B2 |   | 7/2006 | Bult et al. |
| 7,109,918 | B1 | * | 9/2006 | Meadows .................. H01Q 3/36 342/368 |
| 7,321,339 | B2 | * | 1/2008 | Mohamadi .................. H01P 1/184 343/700 MS |
| 7,392,011 | B1 | * | 6/2008 | Jacomb-Hood .................. H01Q 1/288 342/368 |
| 7,414,577 | B2 |   | 8/2008 | Mohamadi |
| 8,446,200 | B2 | * | 5/2013 | Park .................. H03F 3/193 327/108 |
| 8,489,052 | B2 |   | 7/2013 | Bult et al. |
| 2006/0176217 | A1 |   | 8/2006 | Lewis |
| 2011/0080154 | A1 |   | 4/2011 | Yin et al. |
| 2012/0014278 | A1 |   | 1/2012 | Ameti et al. |

OTHER PUBLICATIONS

Wikipedia article, "Transconductance", version issued Sep. 10, 2012.*

(Continued)

*Primary Examiner* — Frank J McGue
(74) *Attorney, Agent, or Firm* — Donna P. Suchy; Daniel M. Barbieri

(57) ABSTRACT

A phase shifter including two or more amplifiers having transistors with approximately linear transconductance to current relationships. The phase shifter also includes one or more loads connected to the transistors of the amplifiers and configured to adjust the gain of the amplifiers by varying the transconductance of the transistors.

20 Claims, 6 Drawing Sheets

(56) References Cited

OTHER PUBLICATIONS

Advisory Action issued in U.S. Appl. No. 13/737,777, dated Jun. 30, 2014, 10 pages.
Office Action on U.S. Appl. No. 13/737,777 Dated Dec. 11, 2013, 9 pages.
Attenuator (electronics), en. wikipedia.org/wiki/Attenuator_(electronics), Nov. 14, 2012, 5 pages.
Circulator, en.wikipedia.org/wiki/Circulator, retrieved Dec. 5, 2012, 3 pages.
Digital Step Attenuators Offer Precision and Linearity, Mini Circuits, Jun. 21, 2011, 11 pages.
Digital-to-Analog Converter, en.wikipedia.org/wiki/Digital-to-analog_converter, retrieved Nov. 26, 2012, 7 pages.
Fenn et al., The Development of Phased-Array Radar Technology, 2000, 20 pages.
Gilbert Cell UHF Transistor Array, Intersil, Sep. 2004, 12 pages.
Hopkins et al., Aperture Efficiency of Amplitude Weighting Distributions for Array Antennas, 9 pages.
Koh et al., A Millimeter-Wave (4001345 GHz) 16-Element Phased-Array Transmitter in 0.18-um SiGe BiCMOS Technology, May 2009, 12 pages.
Koh et al., A Q-Band Four-Element Phased-Array Front-End Receiver with Integrated Wilkinson Power Combiners in 0.18-um SiGe BiCMOS Technology, Sep. 2008, 8 pages.
LMX2216 0.1 GHz to 2.0 GHz Low Noise Amplifier/Mixer for RF Personal Communications, National Semiconductor, Aug. 1995, 12 pages.
Nickel, Fundamentals of Signal Processing for Phased Array Radar, 2006, 22 pages.
Phase (waves), en.wikipedia.org/wiki/ Phase_(waves), retrieved on Nov. 26, 2012, 5 pages.
Phased Array Antennas, http://www.microwaves101.com/encyclopedia/phasedarrays.cfm, retrieved Nov. 20, 2012, 6 pages.
Ta et al., A Millimeter-Wave Phase Shifter on CMOS for Beamforming Applications, Jul. 2008, 4 pages.

* cited by examiner

US 9,667,235 B1

ULTRA-PRECISION LINEAR PHASE SHIFTER WITH GAIN CONTROL

BACKGROUND

The present disclosure relates generally to phase shifters. More particularly, the present application relates to a phase shifter that may be used in an electronically scanned array and in other devices that require ultra-high precision phase control.

Phase shifters are used in a variety of applications. In one example, a phase shifter may be used in a wired network to match signal phases across coaxial cables. In another example, phase shifters may be used in a speaker system to account for different distances between a human user and the various speakers (e.g., so that the sounds heard by the user are phase matched). In a further example, a phase shifter may be used in a motor controller to control the phases of the motor's input voltages.

Phase shifters generally fall into two categories: analog phase shifters and digital phase shifters. Analog phase shifters allow for a continuously variable phase, but are typically susceptible to noise. Digital phase shifters are typically less susceptible to noise than their analog counterparts, but only allow for discrete phase shifts. For example, a digital phase shifter may only allow for phase shifts in forty five degree increments. Applicants have discovered that there may be a need for an ultra-precise phase shifter that approaches the controllability of an analog phase shifter, while maintaining the immunity to noise of a digital phase shifter.

SUMMARY

One embodiment of the present disclosure relates to a phase shifter. The phase shifter includes a component signal generator configured to receive an input signal and to split the input signal into component signals having different phases. The phase shifter also includes two or more amplifiers configured to receive the component signals and to generate adjusted component signals by applying different gains to the component signals. The two or more amplifiers include transistors having approximately linear transconductance to current relationships. The phase shifter also includes an output port configured to combine the adjusted component signals into an output signal that includes a phase-shifted form of the input signal. The phase shifter further includes one or more loads connected to the transistors of the amplifiers and configured to adjust the gain of the amplifiers by varying the transconductance of the transistors.

Another embodiment of the present disclosure relates to an electronically scanned antenna array. The antenna array includes a plurality of antenna elements configured to transmit a beam that includes signals emitted by the antenna elements. The antenna array also includes a plurality of phase shifters connected to the antenna elements and configured to direct the beam by phase shifting the signals emitted by the antenna elements. Each phase shifter includes a component signal generator configured to receive an input signal and to split the input signal into component signals having different phases. Each phase shifter also includes two or more amplifiers configured to receive the component signals and to generate adjusted component signals by applying different gains to the component signals. The two or more amplifiers include transistors having approximately linear transconductance to current relationships. Each phase shifter further includes an output port configured to combine the adjusted component signals into an output signal that includes a phase-shifted form of the input signal. Each phase shifter additionally includes one or more loads connected to the transistors of the amplifiers configured to adjust the gain of the amplifiers by varying the transconductance of the transistors.

A further embodiment of the present disclosure relates to a phase shifter. The phase shifter includes means for splitting an input signal into component signals having different phases. The phase shifter also includes amplifier means for applying differential gains to the component signals to form adjusted component signals. The phase shifter further includes output means for providing a phase-shifted form of the input signal, the phase-shifted form of the input signal that includes the amplified component signals. The phase shifter additionally includes control means for controlling the gains of the amplifiers.

BRIEF DESCRIPTION OF THE DRAWINGS

The invention will become more fully understood from the following detailed description, taken in conjunction with the accompanying drawings, wherein like reference numerals refer to like elements, in which.

Like reference numbers and designations in the various drawings indicate like elements.

DETAILED DESCRIPTION

Referring generally to the Figures, an ultra-precision linear phase shifter is disclosed. In various embodiments, the phase shifter has full scale (e.g., 360°) coverage and may have sub-degree tuning capability. The phase shifter may also have ultra-high precision across a wide range of temperature variations or variations in its power supply voltage. In some embodiments, transistors having a nearly linear transconductance to current relationship may be used as components in the phase shifter. In further embodiments, the ultra-precision phase shifters described herein may be used within an electronically scanned array (ESA) to control the direction in which the radar's beam is pointed.

Figure 1A:
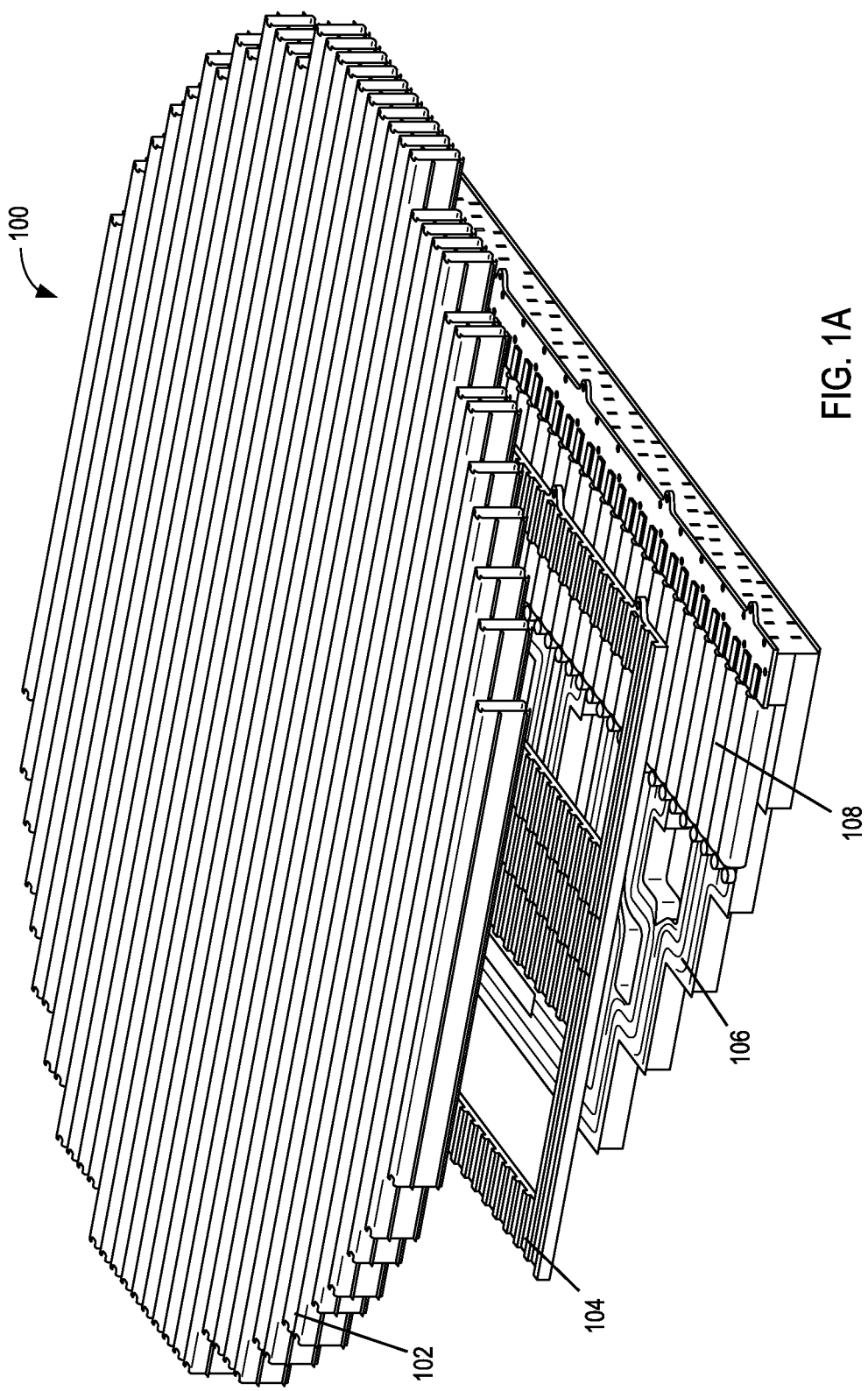
FIG. 1A is an exploded view of an electronically scanned array, according to an exemplary embodiment.

Referring now to FIG. 1A, an exploded view of an ESA 100 is shown, according to an exemplary embodiment. In one embodiment, ESA 100 is a one-dimensional antenna array (a planar 2D array that scans in one direction) and may be an edge slotted waveguide antenna. In other embodiments, ESA 100 is a multi-dimensional antenna array. Also referred to as a phased array, ESAs such as ESA 100 may be configured to direct a beam in any number of different directions without mechanically altering their positions. For example, ESA 100 may be in an upright position and perform radar scans in any number of vertical or horizontal directions, without mechanically changing the orientation of ESA 100.

As shown, ESA 100 includes an array of elements 102 which function to direct radio frequency waves (e.g., microwaves, ultra-high frequency waves, etc.) away from ESA 100 or to receive radio frequency waves. In one embodiment, ESA 100 may be used in a radar system to transmit a radar beam and to receive radar returns. In other embodiments, ESA 100 may be used in a communications system to transmit or communication signals. For example, ESA 100 may be used in a satellite communication system to transmit data to a remote location. ESA 100 may be of any number of different shapes or forms. For example, ESA 100 may be circular, square, rectangular, elliptical, or may be another shaped contour. ESA 100 also includes a feed manifold 106 and a mounting frame 104 for coupling elements 102 to feed manifold 106. According to an exemplary embodiment, feed manifold 106 and the array of elements 102 are easily separable, allowing for individual testing and repairing. Coupled to the array of elements 102 are phase shifters 108, configured to adjusted the phases of signals sent to elements 102 via feed manifold 106. Alternatively, or in addition to adjusting the phases of broadcasted signals, phase shifters 108 may adjust the phases of signals received by elements 102. By controlling the phase and amplitudes of the signals, for example, the direction of the beam emitted from ESA 100 may be adjusted without having to mechanically move ESA 100.

Figure 1B:
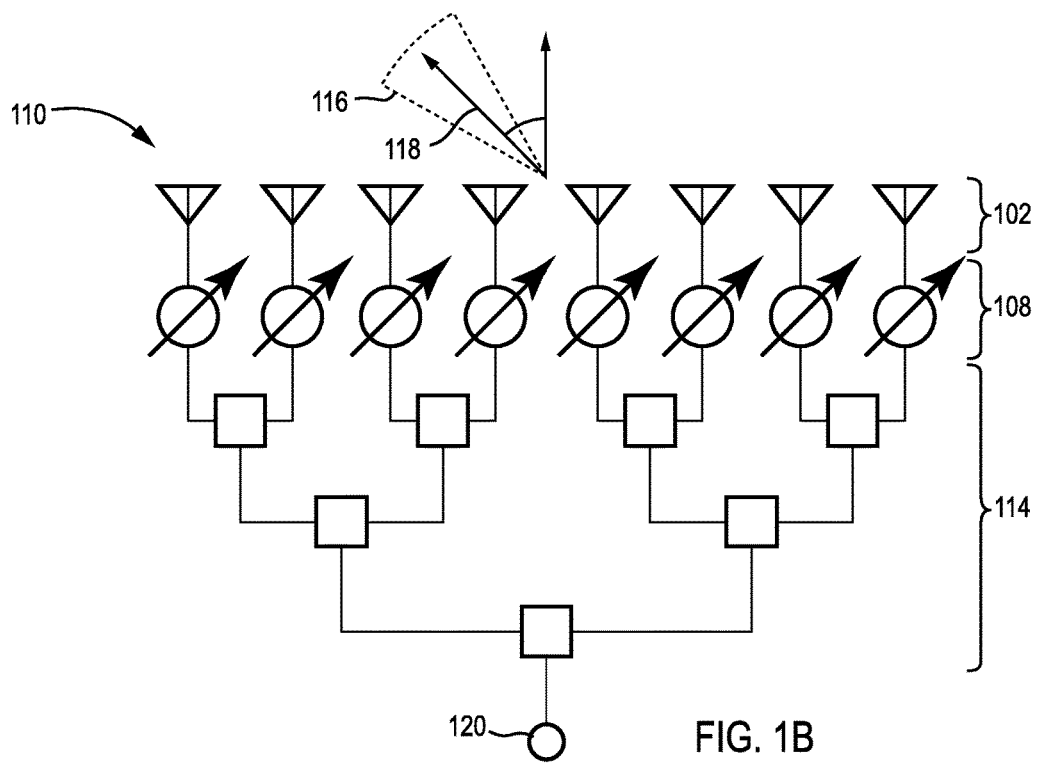
FIG. 1B is a schematic illustration of a row of elements of the electronically scanned array shown in FIG. 1A, according to an exemplary embodiment.

Referring now to FIG. 1B, a schematic illustration 110 is shown of a row of elements of the ESA 100 shown in FIG. 1A, according to an exemplary embodiment. As shown, the elements 102 of ESA 100 may be arranged in rows. According to some embodiments, each row of elements 102 may receive a signal from a signal source 120, which generates a radio frequency signal to be emitted from ESA 100 by elements 102. A power divider network 114 may divide the signal generated by signal source 120 and route the divided signals to elements 102. Coupled to elements 102 and power divider network 114 are phase shifters 108, which are configured to control the phase and/or gain of the signals provided to the individual elements 102 by power divider network 114.

Elements 102 may be separated by a uniform distance (d), according to one embodiment. The individual signals emitted by elements 102 may combine to form a beam 116 directed along a direction 118. Beam 116 may be emitted as a broadside beam orthogonal to ESA 100 (e.g., angle θ=0) when the phase shift (φ) produced by phase shifters 108 are also zero. To direct beam 116 at a different direction, such as along direction 118, phase shifters 108 may produce phase shifts as follows:

$$\phi_n = nkd^* \sin(\theta)$$

where n is the nth element in the row of elements 102, $\phi_n$ is the phase excitation of the nth element in the row of elements 102, d is the distance between elements 102 in the row, θ is the angle of beam 116 when directed along direction 118, and k is the wave number (e.g., $2\pi/\lambda$) of the emitted signal having a wavelength λ. In some embodiments, phase shifters 108 may also control the amplitudes of their respective signals, to control the resulting shape of beam 116 and its sidelobes. In other embodiments, signals received via elements 102 may be phase shifted by phase shifters 108 for further processing.

Figure 2:
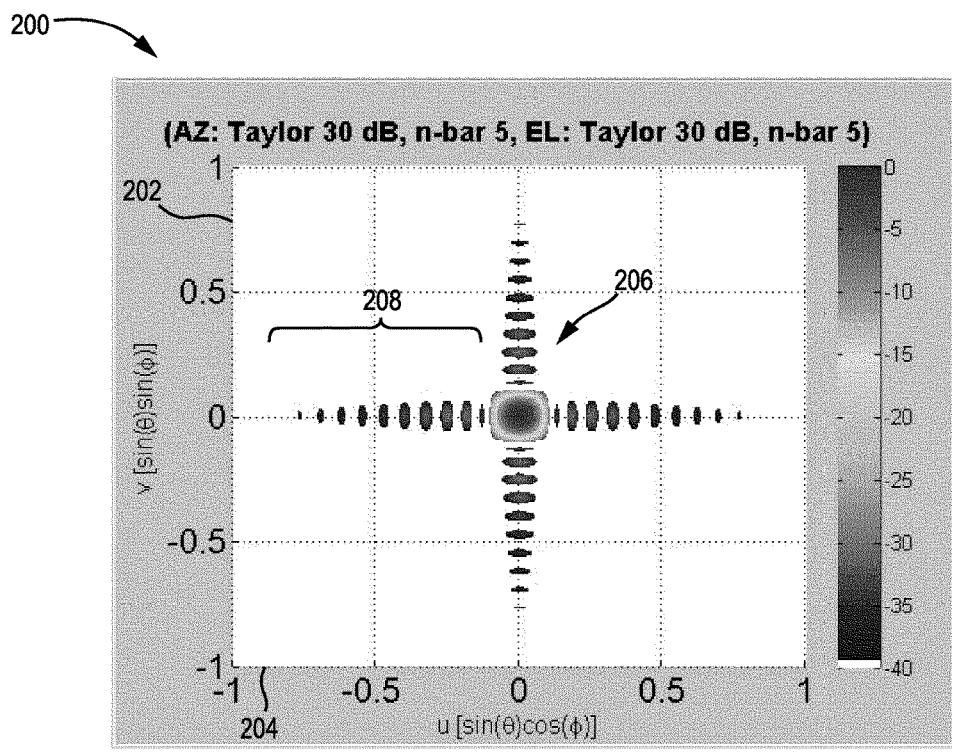
FIG. 2 is an illustration of an ideal radiation pattern for an electronically scanned array, according to an exemplary embodiment.

Referring now to FIG. 2, an illustration 200 is shown of an ideal radiation pattern for an ESA, according to an exemplary embodiment. As shown, the radiation pattern for the beam may be represented in u,v coordinates that correspond to spherical coordinates in three dimensions (e.g., a distance r, azimuth angle θ, and polar angle φ). In other words, the radiation pattern may be represented as a Q×P matrix of values u,v that represent the lengths of vectors P and Q, respectively. The magnitudes of values in the Q×P matrix are measured in decibels (dB), in one embodiment. For example, the u coordinates along axis 204 represent values ranging from −1 to 1 (e.g., the value of sin(θ)cos(φ)), while the v coordinates along axis 202 represent values ranging from −1 to 1 (e.g., the value of sin(θ)sin(φ)).

In an ideal case, the radiation pattern of an ESA includes a main beam 206 having the highest amplitude. Separated from main beam 206 are side lobes 208 (e.g., portions of the radiated signal that surround main beam 206) that result from the aperture distribution of the ESA. Also in an ideal case, the amplitudes of side lobes 208 taper off going farther away from main beam 206. In some embodiments, the amplitudes of side lobes 208 may be controlled by applying an amplitude weighting to the signals transmitted by the different elements of the ESA. Thus, main beam 206 may be directed via phase control of the signals and the taper of side lobes 208 may be controlled via amplitude weighting, according to one embodiment.

Figure 3:
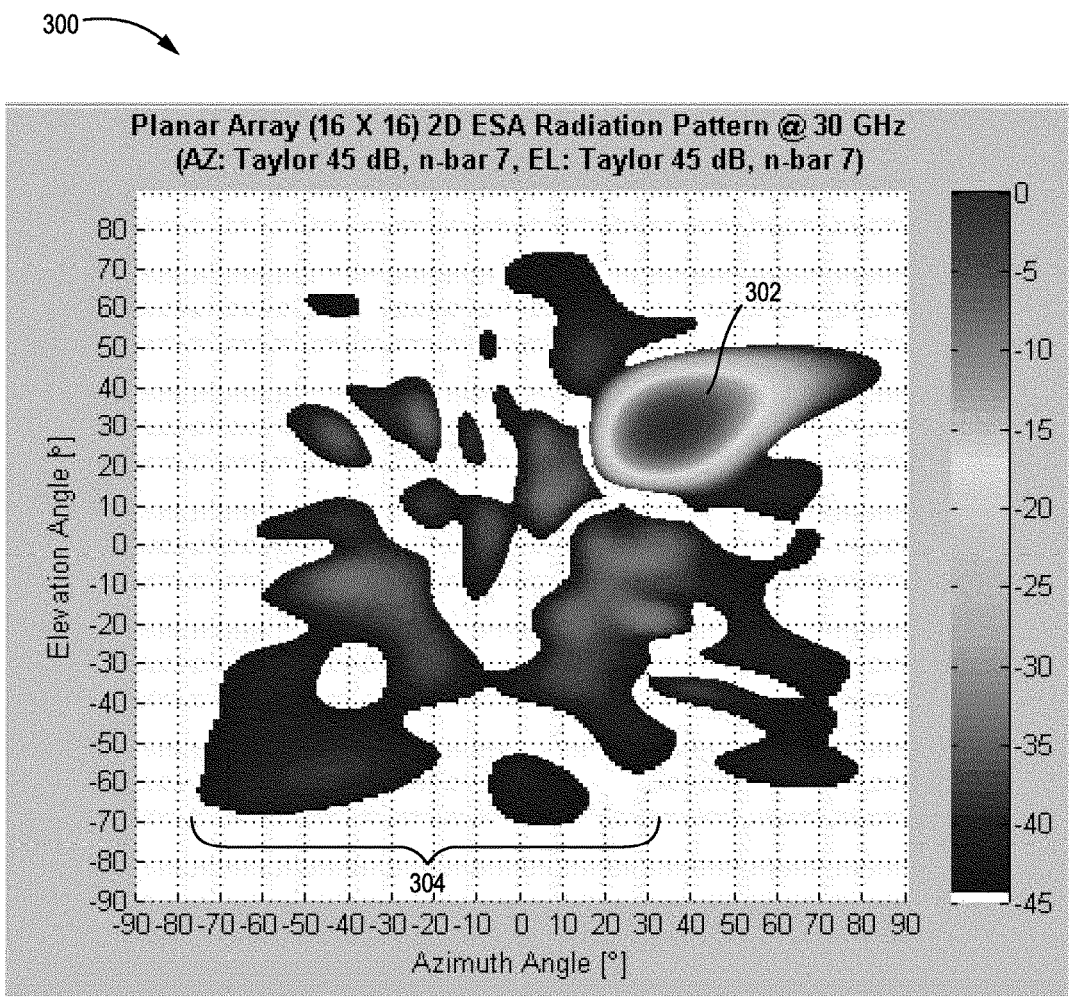
FIG. 3 is an illustration of a radiation pattern for an electronically scanned array exhibiting phase error, according to an exemplary embodiment.

Referring now to FIG. 3 an illustration 300 is shown of a radiation pattern for an electronically scanned array exhibiting phase error, according to an exemplary embodiment. As shown, deterministic (e.g., periodic) and random errors in the phases of the signals emitted along the aperture of the ESA may result in radiation pattern shown in illustration 300. Unlike the ideal radiation pattern shown in FIG. 2, the amplitudes of side lobes 304 do not taper away from main beam 302. In some cases, the phase errors may result from errors due to the imprecise control of the ESA's phase shifters. For example, a phase shifter having a high phase swing may not be able to precisely control the phase shifts of the signals emitted by the ESA's elements, resulting in non-tapered side lobes 304.

Figure 4:
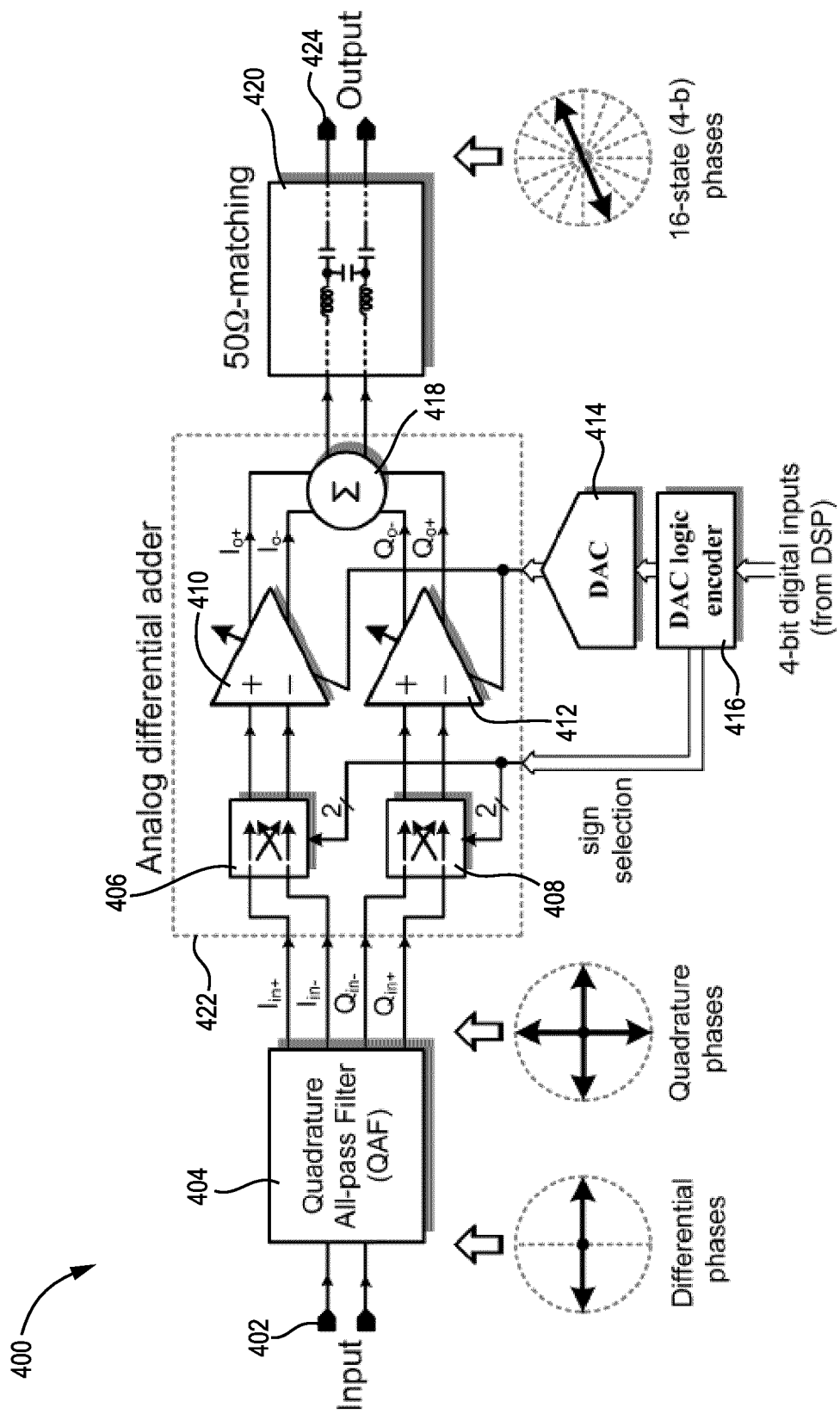
FIG. 4 is a schematic block diagram of a phase shifter, according to an exemplary embodiment.

Referring now to FIG. 4, a schematic block diagram is shown of a phase shifter 400, according to various embodiments. In some embodiments, phase shifter 400 may be used in an ESA (e.g., as one of phase shifters 108 shown in FIG. 1B) or in other applications. In other embodiments, phase shifter 400 may be used in other applications, such as high-frequency communication devices, wireless data networking devices, motor controllers, and the like.

According to various embodiments, phase shifter 400 uses a vector modulation technique to shift the phase of an input signal received at input 402. In one embodiment, the input signal is divided into in-phase (I) signals and quadrature-phase (Q) signals. The quadrature signals correspond to the out of phase components of the input signals having a phase shift of ninety degrees from the in-phase components. A phase shift of the input signal is then realized by controlling the gain of the I-signal relative to the gain of the Q-signal. For example, elimination of the I-signal would result in a 90 degree phase shift of the input signal.

The input signal received at input 402 may be received at a component signal generator 404 configured to split the input signal into its differently phased components. In one embodiment, component signal generator is a quadrature all-pass filter that filters the input signal into its I and Q components (e.g., $I_{in+}$, $I_{in-}$, $Q_{in+}$, and $Q_{in-}$). In various embodiments, the I and Q signal components may be provided to an analog differential adder 422 configured to adjust the phase of the input signal. Differential adder 422 may include sign selectors 406, 408, configured to select the sign of the I and Q signal components to be amplified by differential adder 422, respectively. For example, sign selector 406 may select the sign of the amplification provided to the I component signals (e.g., the effective phase of the I signal) such that a zero or 180° is applied to it. In one embodiment, sign selectors 406, 408 may be 2-bit controllable data selectors configured to forward one of the signal components to one of two possible outputs. Differential adder 422 also includes amplifiers 410, 412 configured to apply controllable amplification to the selected I and Q signal components, respectively. The amplified I and Q components (e.g., $I_{o+}$, $I_{o-}$, $Q_{o+}$, and $Q_{o-}$) are then recombined at block 418 and provided to an impedance matching block 420 to generate the phase shifted output signal from output 424.

According to some embodiments, differential adder 422 is controlled digitally. For example, a digital signal processor (DSP) may provide digital control signals to a logic encoder block 416, which logically processes the digital control signals into control signals for sign selectors 406, 408 and amplifiers 410, 412. For example, one or more bits of the digital input signal from the DSP may be processed by logic encoder block 416 to produce the control signals for sign selectors 406, 408. Logic encoder block 416 may also provide at least a portion of the control signal received from the DSP to a digital to analog converter (DAC) 414. DAC 414 is configured to convert the received digital signals into analog control signals which may be used to control the gains of amplifiers 410, 412, in various embodiments. DAC 414 may be a single converter configured to convert the digital control signal into analog form to control the components phase shifter 400. Alternatively, DAC 414 may include two or more converters each configured to convert one or more bits of the digital control signal. For example, each bit of the digital control signal received from the DSP may be converted by a separate converter in DAC 414. In various embodiments, DAC 414 may use pulse width modulation, oversampling, binary weighting, or another conversion technique to convert the digital control signal into analog signals, in various embodiments.

The gain of amplifiers 410, 412 may be controlled to determine the amount of phase shift applied to the input signal received at input 402. In particular, the ratio of amplification by amplifier 410 to the ratio of amplification by amplifier 412 may be varied to control the phase shift of the input signal received at input 402. For example, if the input signal is divided into its orthogonal I and Q components by component signal generator 404, increasing the I/Q amplification ratio via control of amplifiers 410, 412 may decrease the phase of the input signal. In other words, the gains of amplifiers 410, 412 may be controlled such that the zero degree component of the input signal (e.g., the I component signal) is emphasized and the ninety degree component (e.g., the Q component signal) is deemphasize in the output signal that results at output 424. Similarly, decreasing the I/Q amplification ratio via control of amplifiers 410, 412 may increase the phase of the input signal.

Figure 5:
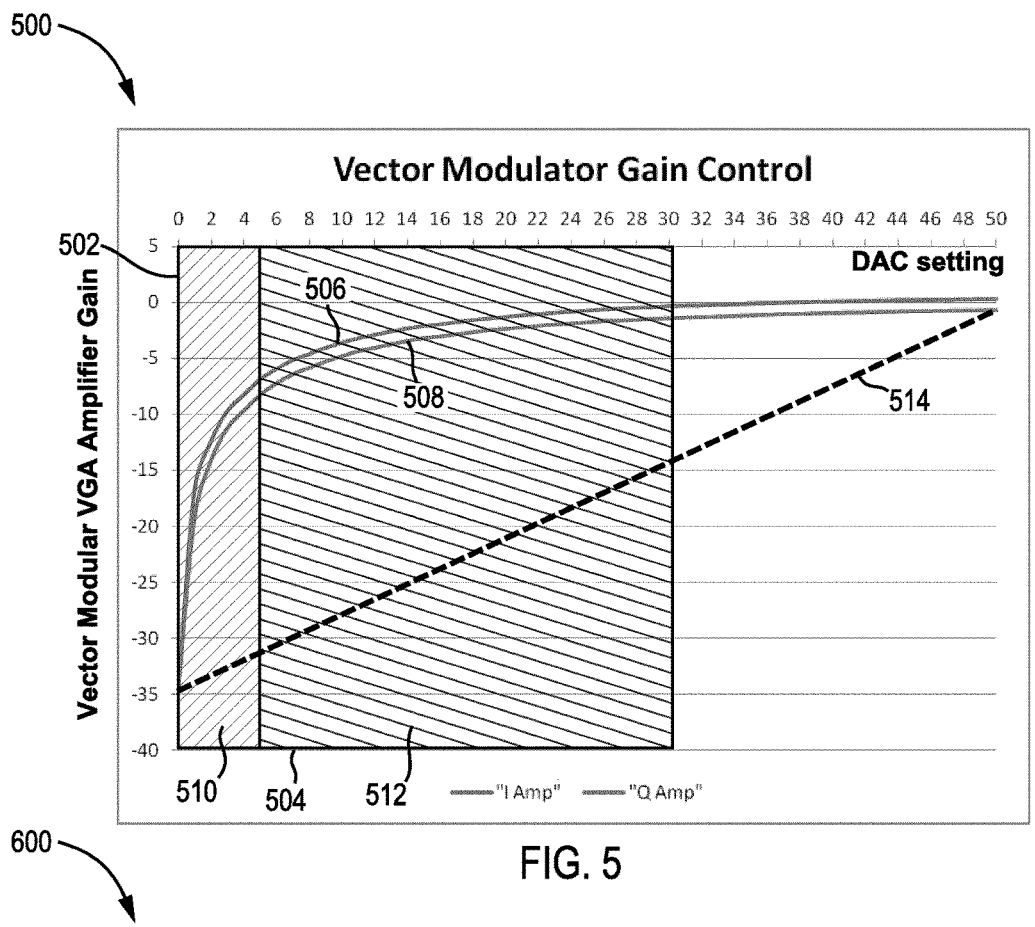
FIG. 5 is a plot of gain curves for a phase shifter, according to an exemplary embodiment.
Figure 6:
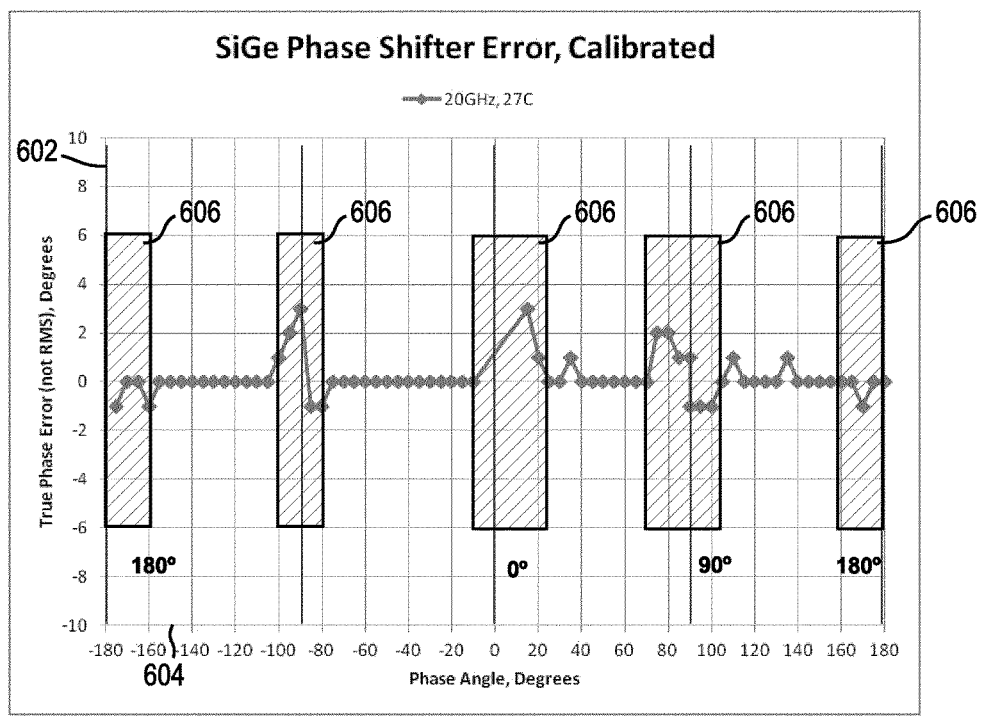
FIG. 6 is a plot of phase error for a phase shifter, according to an exemplary embodiment.

Referring now to FIGS. 5-6, the effects of non-linear gain control on the phase error of a phase shifter are shown, according to various embodiments. FIG. 5 shows a plot 500 of gain curves for a phase shifter as a function of its gain control signals. FIG. 6 shows a plot 600 of phase error for the phase shifter as a function of its controlled phase shift.

As shown in FIG. 5, an input signal may be divided by a phase shifter into its I and Q components and each of these component signals amplified separately to control the phase shift of the input signal. In some embodiments, such as phase shifter 400 shown in FIG. 4, the amplification gains applied to the I and Q components may be controlled using analog control signals provided by one or more digital to analog converters. The DAC controlling the gain of the I and Q amplifiers may utilize a number of settings shown along axis 504 of plot 500. In response to regulation of the DAC settings, the gains of the I and Q amplifiers may also vary, as shown along axis 502 of plot 500.

In some cases, the topology and construction of a phase shifter may be such that the gain slopes of its I and Q amplifiers are non-linear. For example, variation of the DAC settings may result in non-linear gain curves 506, 508 for the I and Q amplifiers of the phase shifter, respectively (e.g., gain curves 506, 508 may result when applying a gain via one of the I or Q amplifiers, while keeping the other amplifier in an "off" state). Within high error region 510 of plot 500, gain curves 506, 508 may exhibit significant variation in their respective amplifier gains due to the non-linear characteristics of the phase shifter. Within region 512, curves 506, 508 may exhibit a more linear gain response, but still may exhibit some non-linear characteristics.

In one example, assume that the phase shifter is constructed using complementary metal oxide semiconductor (CMOS) field effect transistors (FETs). CMOS FETs exhibit non-linear transconductances near pinch-off, resulting in the I and Q amplifiers exhibiting the greatest non-linear gain characteristics around the points at which amplification is first being applied to one of the component signals. These points correspond to the edges of the controlled phase quadrants (e.g., around the −180°, −90°, 0°, +90°, and +180° phase shifts). In other words, the precision at which the phase shifter is able to shift the phase of the input signal may vary depending on how much of a phase shift is being applied. For example, a phase shift of +1° may result in a higher amount of phase error than if the input signal is phase shifted by +30°.

As shown in more detail in FIG. 6, the phase error 602 in a phase shifter may vary as a function of the applied phase shift 604. Around the edges of the phase quadrants, there may exist high error regions 606 in which the true phase error (e.g., measured in degrees) is non-zero. For example, the high error region 606 around 0° may have a true phase error that ranges up to approximately +3°. Thus, an intended phase shift of 10° may result in an actual phase shift of 13°. Conversely, some phase shifts outside of high error regions 606 may exhibit approximately zero phase error. For example, a phase shift of +50° may have little to no phase shift error, thereby exhibiting high precision in this region.

According to various embodiments, a phase shifter may be constructed such that it exhibits a linear gain curve 514 for its I and Q amplifiers, as shown in plot 500. Since the gain of the I and Q amplifiers vary linearly with the DAC settings, high error region 510 may be reduced or eliminated. As a result, the high error regions 606 in plot 600 may also be eliminated, thereby removing the non-zero true phase errors that exist in these regions. Similarly, the linearization of the gain curves in region 512 may also reduce or eliminate true phase error present between high error regions 606. As a result, the input signal to the phase shifter may be applied across the entire 360° range with ultra-high precision.

In some embodiments, a phase shifter may be constructed using circuit elements that exhibit linear transconductance characteristics. For example, some bi-junction transistors (BJTs) and hetrojunction BJTs (HBTs) may exhibit a transconductance relationship as follows:

$$g_m \cong \frac{I_c}{V_t}$$

where $g_m$ is the transconductance, $I_c$ is the current through the transistor's collector, and $V_t$ is the transistor's thermal voltage ($V_t=k*T/q$, which is approximately 26 mV at room temperature). Since the transconductance varies linearly, so too does the amplification provided by the transistor. By varying the bias currents into the respective I and Q amplifiers of the phase shifter, the transconductance of one amplifier may vary linearly with respect to the other amplifier. For example, the amplification provided by the I amplifier may be increased linearly while the amplification provided by the Q amplifier may be decreased linearly, thereby allowing for a predicable and controllable phase shift to the input signal.

Figure 7:
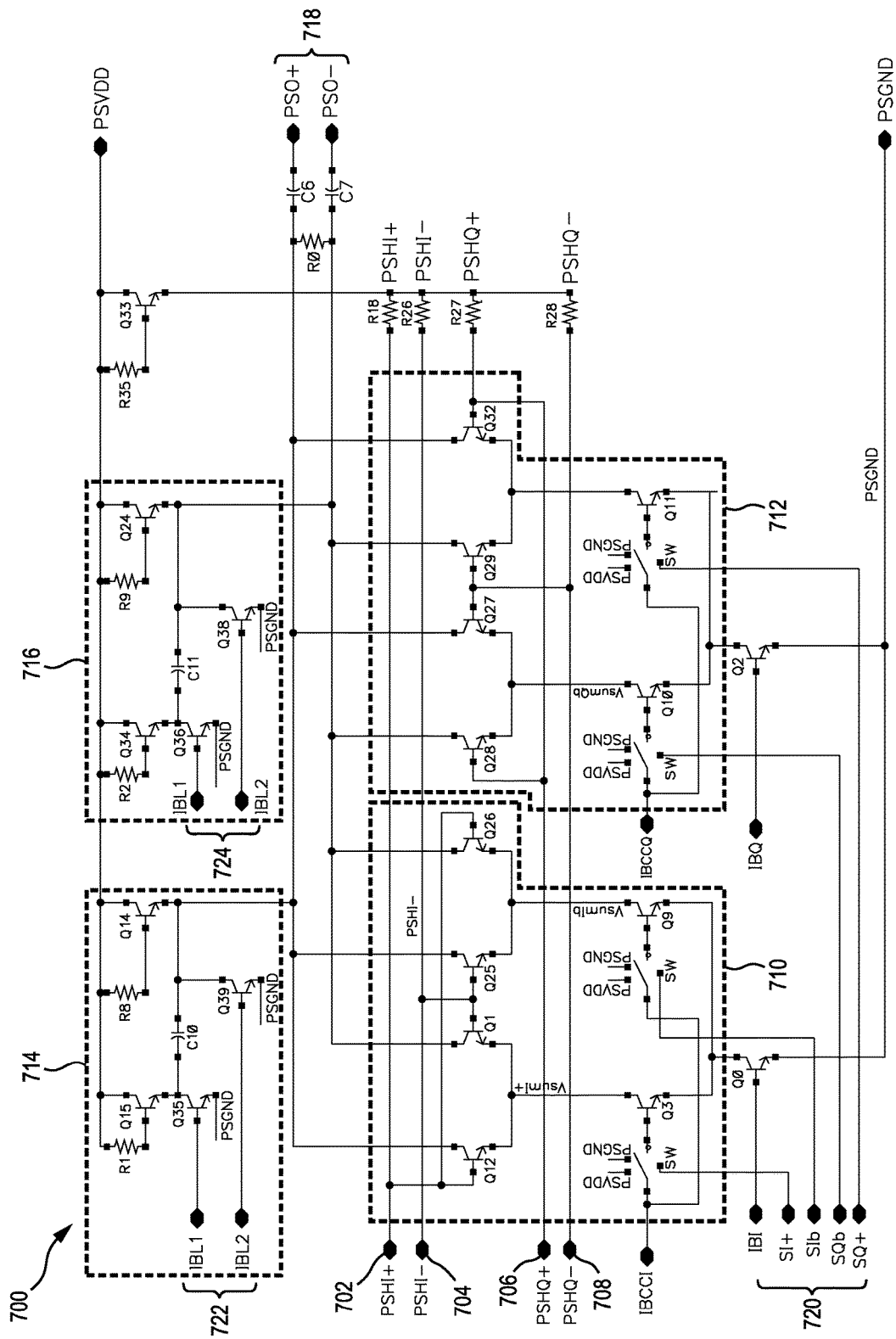
FIG. 7 is a circuit diagram of a differential adder, according to an exemplary embodiment.

Referring now to FIG. 7, a circuit diagram of a differential adder 700 is shown, according to an exemplary embodiment. According to various embodiments, differential adder 700 may be used within a vector phase shifter, such as phase shifter 400 shown in FIG. 4. Differential adder 700 is generally configured to receive components of an input signal (e.g., the input signal's I and Q components) and to output a phase-shifted combination of the input signal's components. As shown, differential adder 700 may receive I component signals (e.g., I+ and I− signals) at inputs 702, 704, respectively. Differential adder 700 may also receive Q component signals (e.g., Q+ and Q− signals) at inputs 706, 708, respectively.

Differential adder 700 may include separate amplifiers 710 and 712. Amplifier 710 applies a gain to the I component signals (e.g., I+ and I−) received at inputs 702, 704. Likewise, amplifier 712 applies a gain to the Q component signals (e.g., Q+ and Q−) received at inputs 706, 708. In various embodiments, differential adder 700 uses amplifiers 710, 712 to apply different gains to the I and Q signal components received via inputs 702-708. Differential adder 700 may also include additional amplifiers, if the signal to be phase shifted is divided into further components (e.g., differential adder 700 may include four amplifiers to phase shift a signal divided into eight phase components). In some embodiments, amplifiers 710, 712 may include differential amplifiers (e.g., transistor pairs) constructed in parallel with cross coupled outputs to allow for four quadrant multiplication. For example, amplifiers 710, 712 may include transistor pairs (e.g., {Q12, Q1}, {Q25, Q26}, etc.) having common emitters. Another transistor may also be connected to each common emitter junctions (e.g., the emitters of {Q12, Q1} may be connected to Q3, the emitters of {Q25, Q26} may be connected to Q9, etc.). Activation of either of the differential amplifiers in amplifiers 710, 712 may be achieved by activating corresponding switches, which control the bias routes in amplifiers 710, 712. For example, either of the differential amplifiers in amplifier 710 may be activated by toggling switches connected to transistors Q3 and Q9. Control of these switches may be used to regulate the sign of the amplified I or Q signals (e.g., either of the amplified I or Q signals may be phase shifted by 180° via control of the switches).

The outputs of amplifiers 710, 712 may be connected to one another, thereby combining the amplified I and Q signals into a differential output signal (e.g., O+ and O−) provided by differential adder 700 via output 718. For example, the collectors of opposing transistors in the differential amplifiers of amplifier 710 may be connected to the lines of O+ and O−, respectively (e.g., the collector of transistor Q12 is connected to the O+ line of output 718 and collector of transistor Q26 is connected to the O− line of output 718, etc.). As a result of the cross coupling, the sign of the I or Q signal may be reversed by operating the switches connected to transistors Q3 and Q9-12 (e.g., a 180° phase shift may be applied to either or both of the I or Q signals by operation of these switches to change the bias paths of the amplifiers), allowing for four-quadrant phase control over the input signal. For example, activation of the switch connected to Q3 results in the I component signal having a positive sign while the switch connected to Q9 is deactivated. Similarly, activation of the switch connected to Q9 results in the sign of the I signal having a negative sign when the switch connected to Q3 is deactivated (e.g., the phase of the I signal is phase shifted 180°). The same holds true for the switches connected to Q10-Q11 in amplifier 712. In this way, the phase of the resulting output signal may be regulated by providing control signals to inputs 720 to control the signs of the I and Q signals. For example, removing the bias current from transistor Q0 in amplifier 710 thereby eliminates the I component signal, resulting in an output signal that has been phase shifted by 90°.

In various embodiments, amplifiers 710, 712 may be constructed using BJTs, such as HBTs. The BJTs may be NPN or PNP configuration, in various embodiments. Any number of different compounds may also be used to construct the transistors of amplifiers 710, 712. For example, amplifiers 710, 712 may be constructed using silicon-germanium (SiGe), in one embodiment. In various embodiments, the transistors in amplifiers 710, 712 generally exhibit a transconductance to current relationship that is approximately linear (e.g., $g_m \sim I_c/V_t$). For example, input 702 may be connected to the base of a transistor in each of the differential amplifiers in amplifier 710 (e.g., input 702 may be connected to the bases of transistors Q12 and Q26) and input 704 may be connected to the bases of the other transistors in the differential amplifiers (e.g., input 704 may be connected to the bases of transistors Q1 and Q25). Amplifier 712 may be constructed in a similar manner as amplifier 710 by connecting inputs 706, 708 to the transistor bases of opposing transistors in the differential amplifiers of amplifier 712.

Differential adder 700 also includes amplifier loads 714 and 716, according to various embodiments. In various embodiments, amplifiers 710, 712 are also configured to provide variable gain control over the I and Q component signals by varying the input current to amplifiers 710, 712. In some embodiments, amplifier loads 714, 716 provide loads to the transistors of amplifiers 710, 712. In cases in which amplifiers 710, 712 include transistors having an approximately linear transconductance to current relationship, the gain applied by amplifiers 710, 712 may be controlled to a high degree of precision by varying the amount of current across transistors Q1, Q12, Q25-Q29, and Q32 of amplifiers 710, 712. In one embodiment, amplifier load 714 may be a controllable load for the differential amplifiers of amplifiers 710, 712 that amplify the I and Q signal components. For example, amplifier load 714 may act as a load on the collector of transistor Q12 or Q25 in amplifier 710, depending on which transistor is active at the time (e.g., by using inputs 720 to select activation of Q3 or Q9). Similarly, amplifier load 714 may act as a load on the collector of transistor Q27 or Q32, depending on which branch of amplifier 712 is active. In a similar manner, amplifier load 716 may act as a load on the collector of transistor Q1 or Q26 of amplifier 710 and transistor Q28 or Q29 of amplifier 712. In general, the gain of the amplifier transistors in amplifiers 710, 712 is proportional to their transconductances times the impedances of amplifier loads 714, 716, which are proportional to 1/gm of their combined transistors. In various embodiments, amplifier loads 714, 716 include broadband load transistors with independent bias control (e.g., transistors Q35, Q39, Q14, etc.). The load presented is dominated by the low impedance seen looking into the emitters of transistors Q14, Q15, which is approximately $1/g_m = V_t/I_c$. By regulating the bias of these transistors, the load currents provided to amplifiers 710, 712 can be adjusted thereby resulting in an adjustment to the gains provided by amplifiers 710, 712. Similar to inputs 720, each of amplifier loads 714, 716 may include inputs 722, 724, respectively, which are configured to receive control signals that operate their respective load transistors.

In one embodiment, differential adder 700 may be controlled by a processor, such as a DSP. For example, a DSP may calculate the appropriate phase shift and gain needed to direct the beam of an ESA. Based on these calculations, the DSP may also generate digital control signals to control differential adder 700. These control signals may be converted into analog form by one or more DACs and provided to inputs 720, 722, or 724. As shown in FIG. 4, for example, the control signal may be a 4-bit signal (e.g., differential adder 700 may be controlled to apply any of 2^4=16 different phase shifts to the input signal, each phase shift being separated by 360°/16=22.5°). However, phase shifter 400 may be scaled to accommodate more or less bits than shown in FIG. 4, in various other embodiments. For example, phase shifter 400 may utilize three or more effective bits, six or more effective bits, or ten or more effective bits. Generally, the precision of a phase shifter increases with the number of its bits, if the phase shifter can accurately apply smaller phase steps. For example, a ten bit control signal may allow for 2^10=1024 different phase shifts, which correspond to phase shifts separated by 360°/1024≈0.3516° increments. Thus, phase shifter 400 may be configured to allow for sub-degree phase calibration using differential adder 700, in some embodiments.

The described embodiments of differential adder 700 may also allow for high precision phase control over a wide range of temperature and power supply voltage variations. In particular, the differential structure and high common mode impedances set up by transistors Q0, Q2, Q3, Q9, Q10, and Q11 of differential adder 700 result in rejection immunity to the power supply voltage. As a result of the configurations of amplifiers 710, 712 and amplifier loads 714, 716, the operation of differential adder 700 may also exhibit a high degree of temperature immunity. If transistors having approximately linear current to transconductance relationships are used in differential adder 700 (e.g., gm~$I_c/V_t$), the temperature may affect their transconductances according to $V_t = k*T/q$. However, the temperature would affect each of their transconductances evenly. Since the gain of amplifiers 710, 712 is a function of their transistors' transconductances and 1/gm of the combined transistors in amplifier loads 714, 716, a temperature change affects each of these transconductances the same, thereby allowing differential adder 700 to exhibit a high degree of temperature immunity. In cases in which differential adder 700 uses HBTs, for example, differential adder 700 may exhibit less than two degrees of absolute phase error.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

What is claimed is:

1. A phase shifter comprising: a component signal generator receiving an input signal and splitting the input signal into component signals having different phases; two or more amplifiers coupled to the component signal generator and receiving the component signals and generating adjusted component signals by applying different gains to the component signals, wherein the two or more amplifiers comprise transistors having approximately linear transconductance to current relationships without a non-linear response in a MOSFET pinch off region, wherein each linear transconductance to current relationship is defined by as follows:

$$g_m \cong \frac{I_c}{V_t}$$

where $g_m$ is the transconductance, $I_c$ is the current through the transistor's collector, and $V_t$ is the transistor's thermal voltage; an output port coupled to the two or more amplifiers and combining the adjusted component signals into an output signal comprising a phase-shifted form of the input signal; and one or more loads connected to the transistors of the amplifiers and adjusting the gain of the amplifiers by varying the transconductance of the transistors, wherein the transconductance of the transistors is varied by adjusting load currents provided to collectors of the transistors using the loads.

2. The phase shifter of claim 1, wherein the transistors of the amplifiers comprise bipolar junction transistors.

3. The phase shifter of claim 2, wherein the bipolar junction transistors comprise heterojunction bipolar transistors.

4. The phase shifter of claim 1, further comprising switches for selecting the sign of the component signals.

5. The phase shifter of claim 4, further comprising a digital signal processor providing control signals to the switches.

6. The phase shifter of claim 5, further comprising one or more digital to analog converters converting the control signals into analog control signals.

7. The phase shifter of claim 1, wherein the loads comprise transistor-resistor circuits.

8. The phase shifter of claim 1, wherein the component signal generator comprises a quadrature all-pass component signal generator and the component signals comprise quadrature-phase and in-phase signals.

9. An electronically scanned antenna array comprising: a plurality of antenna elements for transmitting a beam comprising signals emitted by the antenna elements; and a plurality of phase shifters connected to the antenna elements, the phase shifters for directing the beam by phase shifting the signals emitted by the antenna elements or to phase shift signals received via the antenna elements, wherein each phase shifter comprises: a component signal generator for receiving an input signal and splitting the input signal into component signals having different phases; two or more amplifiers for receiving the component signals and generating adjusted component signals by applying different gains to the component signals, wherein the two or more amplifiers comprise transistors having approximately linear transconductance to current relationships without a non linear response in a MOSFET pinch off region, wherein each linear transconductance to current relationship is defined by as follows:

$$g_m \cong \frac{I_c}{V_t}$$

where $g_m$ is the transconductance, $I_c$ is the current through the transistor's collector, and $V_t$ is the transistor's thermal voltage; an output port configured to combine the adjusted component signals into an output signal comprising a phase-shifted form of the input signal; and one or more loads connected to the transistors of the amplifiers and configured to adjust the gain of the amplifiers by varying the transconductance of the transistors, wherein the transconductance is varied by varying a load current provided by the one or more loads to collectors of the transistors.

10. The electronically scanned antenna array of claim 9, wherein the transistors of the amplifiers comprise bipolar junction transistors.

11. The electronically scanned antenna array of claim 10, wherein the bipolar junction transistors comprise heterojunction bipolar transistors.

12. The electronically scanned antenna array of claim 9, further comprising switches for selecting the sign of the component signals.

13. The electronically scanned antenna array of claim 12, further comprising a digital signal processor for providing control signals to the switches.

14. The electronically scanned antenna array of claim 13, further comprising one or more digital to analog converters for converting the control signals into analog control signals.

15. The electronically scanned antenna array of claim 9, wherein the loads comprise transistors.

16. The electronically scanned antenna array of claim 9, wherein the component signal generator comprises a quadrature all-pass component signal generator and the component signals comprise quadrature-phase and in-phase signals.

17. A phase shifter comprising:
means for splitting an input signal into component signals having different phases;
amplifier means for applying differential gains to the component signals to form adjusted component signals, wherein the amplifier means comprises transistors having approximately linear transconductance to current relationships without a non-linear response in a MOSFET pinch-off region, wherein the linear transconductance to current relationship is defined by as follows:

$$g_m \cong \frac{I_c}{V_t}$$

where $g_m$ is the transconductance, $I_c$ is the current through the transistor's collector, and $V_t$ is the transistor's thermal voltage;
output means for providing a phase-shifted form of the input signal, the phase-shifted form of the input signal comprising the amplified component signals; and
control means for controlling the gains of the amplifiers, wherein the control means provides load currents to the transistors to control the differential gains of the amplifier means.

18. The phase shifter of claim 17, further comprising:
means for selecting the signs of the component signals.

19. The phase shifter of claim 17, wherein the control means comprises load transistors connected to collectors of transistors in the amplifier means.

20. The phase shifter of claim 19, wherein the transistors in the amplifier means comprise bipolar junction transistors.

* * * * *